(12) United States Patent
Aoki et al.

(10) Patent No.: US 10,910,996 B2
(45) Date of Patent: Feb. 2, 2021

(54) OSCILLATOR, ELECTRONIC DEVICE, AND VEHICLE

(71) Applicant: SEIKO EPSON CORPORATION, Tokyo (JP)

(72) Inventors: Shinya Aoki, Minowa-machi (JP); Ryuta Nishizawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/797,276

(22) Filed: Feb. 21, 2020

(65) Prior Publication Data

US 2020/0274488 A1  Aug. 27, 2020

(30) Foreign Application Priority Data

Feb. 22, 2019  (JP) ................. 2019-031051

(51) Int. Cl.
| | |
|---|---|
| *G01N 27/00* | (2006.01) |
| *G08B 19/00* | (2006.01) |
| *G08B 21/00* | (2006.01) |
| *H03B 5/04* | (2006.01) |
| *H03L 7/099* | (2006.01) |

(52) U.S. Cl.
CPC ....... *H03B 5/04* (2013.01); *H03B 2200/0018* (2013.01); *H03L 7/0992* (2013.01)

(58) Field of Classification Search
CPC .. H03B 5/04; H03B 2200/0018; H03L 7/0992
USPC .......................................................... 331/66
See application file for complete search history.

(56) References Cited

U.S. PATENT DOCUMENTS

| | | | |
|---|---|---|---|
| 2011/0234325 A1* | 9/2011 | Tanaka | H03L 1/022 331/68 |
| 2014/0152392 A1 | 6/2014 | Owaki et al. | |
| 2016/0285461 A1* | 9/2016 | Okubo | H03L 1/023 |
| 2017/0272082 A1 | 9/2017 | Obata et al. | |
| 2017/0272083 A1 | 9/2017 | Owaki et al. | |
| 2018/0198408 A1 | 7/2018 | Owaki et al. | |
| 2018/0269832 A1 | 9/2018 | Obata | |
| 2018/0278209 A1 | 9/2018 | Obata et al. | |

FOREIGN PATENT DOCUMENTS

| | | |
|---|---|---|
| JP | 2005-286892 | 10/2005 |
| JP | 2014-103627 | 6/2014 |
| JP | 2014-107862 | 6/2014 |
| JP | 2017-175202 | 9/2017 |

(Continued)

*Primary Examiner* — Richard Tan
(74) *Attorney, Agent, or Firm* — Workman Nydegger

(57) ABSTRACT

An oscillator includes a first container, a second container accommodated in the first container, a resonator element accommodated in the second container, a temperature sensor accommodated in the second container, a first circuit element that is accommodated in the second container and includes an oscillation circuit that causes the resonator element to oscillate so as to generate an oscillation signal on which temperature compensation is performed based on a detected temperature of the temperature sensor, and a second circuit element which is accommodated in the first container and includes a frequency control circuit that controls a frequency of the oscillation signal. The second container and the second circuit element are spaced from each other and are disposed to overlap each other in plan view.

11 Claims, 8 Drawing Sheets

(56) References Cited

FOREIGN PATENT DOCUMENTS

| JP | 2017-175203 | 9/2017 |
| JP | 2018-113603 | 7/2018 |
| JP | 2018-142899 | 9/2018 |
| JP | 2018-157377 | 10/2018 |
| JP | 2018-160892 | 10/2018 |

\* cited by examiner

OSCILLATOR, ELECTRONIC DEVICE, AND VEHICLE

The present application is based on, and claims priority from JP Application Serial Number 2019-031051, filed Feb. 22, 2019, the disclosure of which is hereby incorporated by reference herein in its entirety.

BACKGROUND

1. Technical Field

The present disclosure relates to an oscillator, an electronic device, and a vehicle.

2. Related Art

JP-A-2017-175202 discloses an oscillator including an outer package, an inner package accommodated in the outer package, a resonator element accommodated in the inner package, and a circuit element which is accommodated in the outer package and is disposed on the inner package. In the oscillator disclosed in JP-A-2017-175202, the circuit element includes a temperature sensor, and a frequency of an output signal is corrected based on the temperature detected by the temperature sensor.

However, in the oscillator disclosed in JP-A-2017-175202, the circuit element including the temperature sensor is located outside the inner package in which the resonator element is accommodated. Thus, a temperature difference between the temperature sensor and the resonator element easily occurs, and it is difficult to correct the output signal with high accuracy. Therefore, frequency accuracy of the output signal may be degraded.

SUMMARY

An oscillator according to an application example of the present disclosure includes a first container, a second container accommodated in the first container, a resonator element accommodated in the second container, a temperature sensor accommodated in the second container, a first circuit element that is accommodated in the second container and includes an oscillation circuit that causes the resonator element to oscillate so as to generate an oscillation signal on which temperature compensation is performed based on a detected temperature of the temperature sensor, and a second circuit element that is accommodated in the first container and includes a frequency control circuit that controls a frequency of the oscillation signal. The second container and the second circuit element are spaced from each other and are disposed to overlap each other in plan view.

In the oscillator according to the application example, the first container may include a first base substrate having a recess portion, and a first lid bonded to the first base substrate so as to close an opening of the recess portion. The second container may be disposed in the recess portion, and the second circuit element may be disposed between the second container and the first lid.

In the oscillator according to the application example, the recess portion may include a first recess portion opening to a surface of the first base substrate on the lid side, and a second recess portion opening to a bottom surface of the first recess portion. The second container may be bonded to a bottom surface of the second recess portion, the second circuit element may be bonded to the bottom surface of the first recess portion, and the second circuit element may overlap the second recess portion in plan view.

In the oscillator according to the application example, the recess portion may include a third recess portion opening to the bottom surface of the second recess portion. The oscillator may further include a bypass capacitor disposed in the third recess portion.

In the oscillator according to the application example, the second container may include a power supply terminal to which a power supply voltage for the oscillation circuit is applied, and the bypass capacitor may be coupled to the power supply terminal.

In the oscillator according to the application example, the second container may include a temperature output terminal to which an output signal of the temperature sensor is output, and the temperature output terminal may be electrically coupled to the frequency control circuit.

In the oscillator according to the application example, the first container may be decompressed with respect to atmospheric pressure.

In the oscillator according to the application example, the second container may include a second base substrate to which the resonator element is fixed, and a second lid bonded to the second base substrate so as to accommodate the resonator element in a space between the second lid and the second base substrate. The second lid may be bonded to the first base substrate through a bonding member.

An oscillator according to an application example of the present disclosure includes a first container that includes a base substrate and a lid bonded to one main surface of the base substrate and has an internal space, a second container disposed in the internal space, a resonator element accommodated in the second container, a temperature sensor accommodated in the second container, a first circuit element that is accommodated in the second container and includes an oscillation circuit that causes the resonator element to oscillate so as to generate an oscillation signal on which temperature compensation is performed based on a detected temperature of the temperature sensor, and a second circuit element that is disposed on the other main surface of the base substrate and includes a frequency control circuit that controls a frequency of the oscillation signal. The second container and the second circuit element are spaced from each other and are disposed to overlap each other in plan view.

An oscillator according to an application example of the present disclosure includes a first container, a second container that is accommodated in the first container, includes a base substrate and a lid bonded to one main surface of the base substrate, and has an internal space, a resonator element that is disposed in the internal space and is disposed on the base substrate, a temperature sensor disposed on the other main surface of the base substrate, a first circuit element that is disposed on the other main surface of the base substrate and includes an oscillation circuit that causes the resonator element to oscillate so as to generate an oscillation signal on which temperature compensation is performed based on a detected temperature of the temperature sensor, and a second circuit element that is accommodated in the first container and includes a frequency control circuit that controls a frequency of the oscillation signal. The second container and the second circuit element are spaced from each other and are disposed to overlap each other in plan view.

An electronic device according to an application example of the present disclosure includes the above-described oscillator and a signal processing circuit that performs signal processing based on an output signal of the oscillator.

A vehicle according to an application example of the present disclosure includes the above-described oscillator and a signal processing circuit that performs signal processing based on an output signal of the oscillator.

DESCRIPTION OF EXEMPLARY EMBODIMENTS

Hereinafter, an oscillator, an electronic device, and a vehicle according to the preferred embodiments will be described with reference to the accompanying drawings.

First Embodiment

Figure 1:
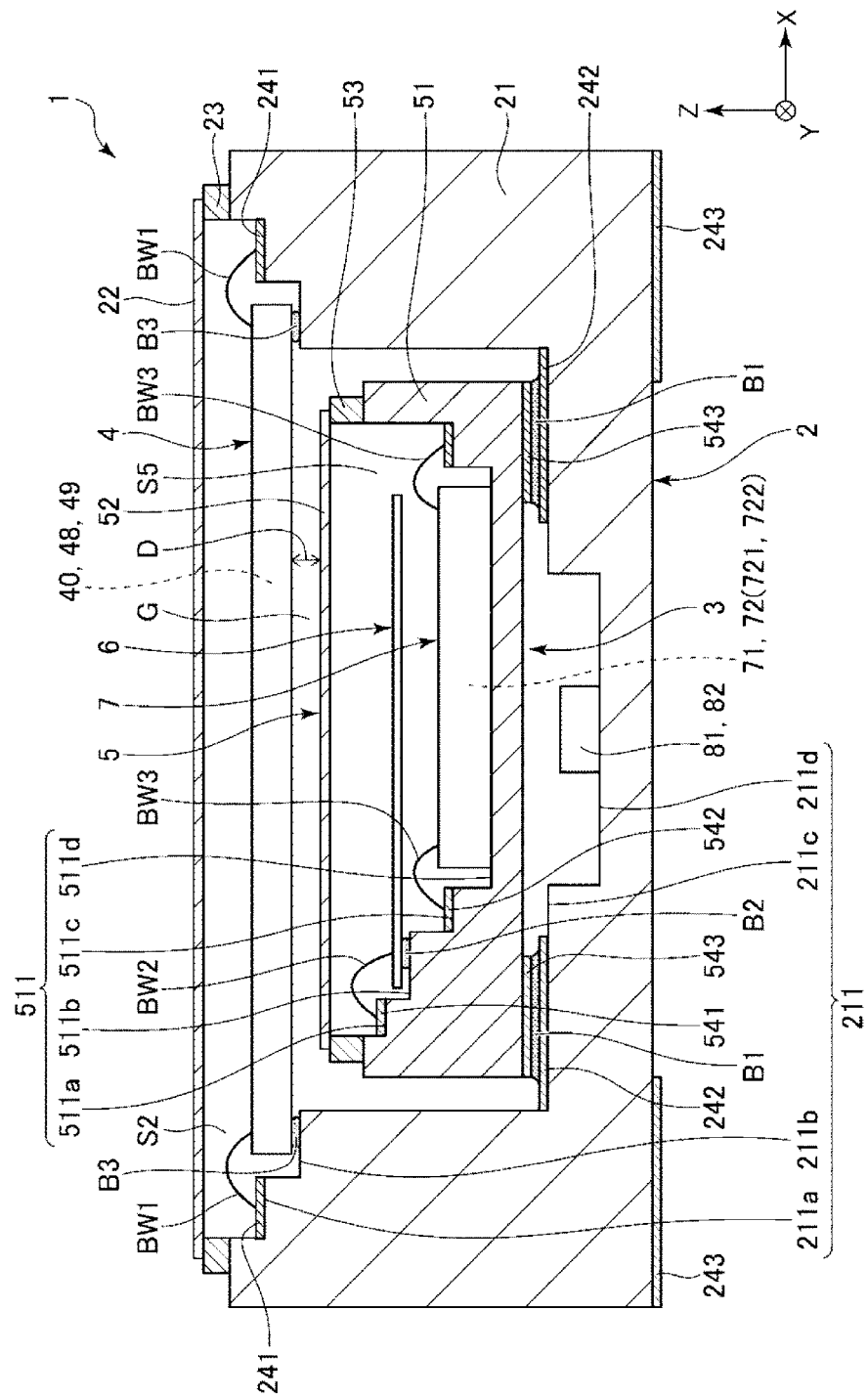
FIG. 1 is a cross-sectional view illustrating an oscillator according to a first embodiment.
Figure 2:
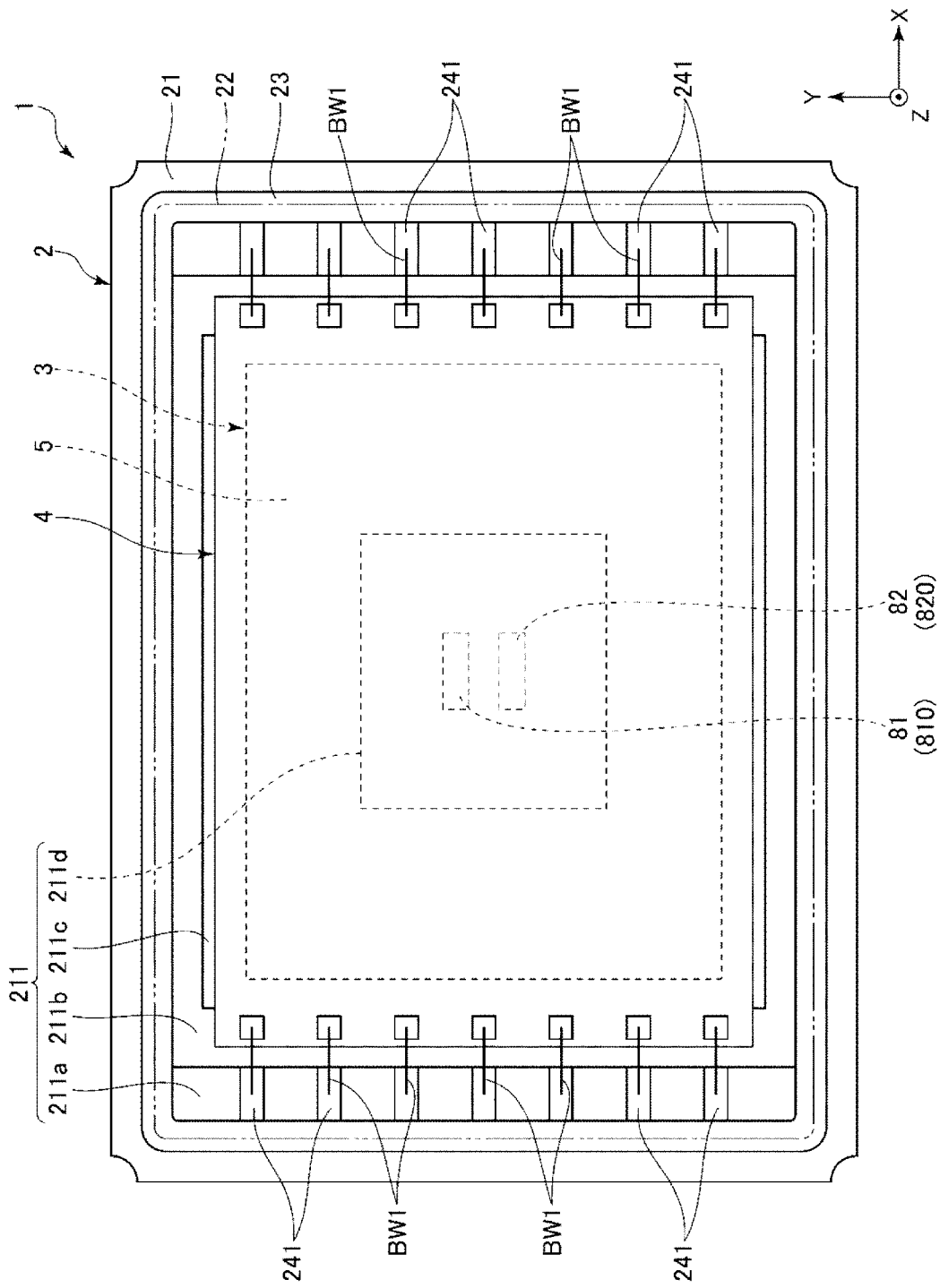
FIG. 2 is a plan view illustrating the oscillator in FIG. 1.
Figure 3:
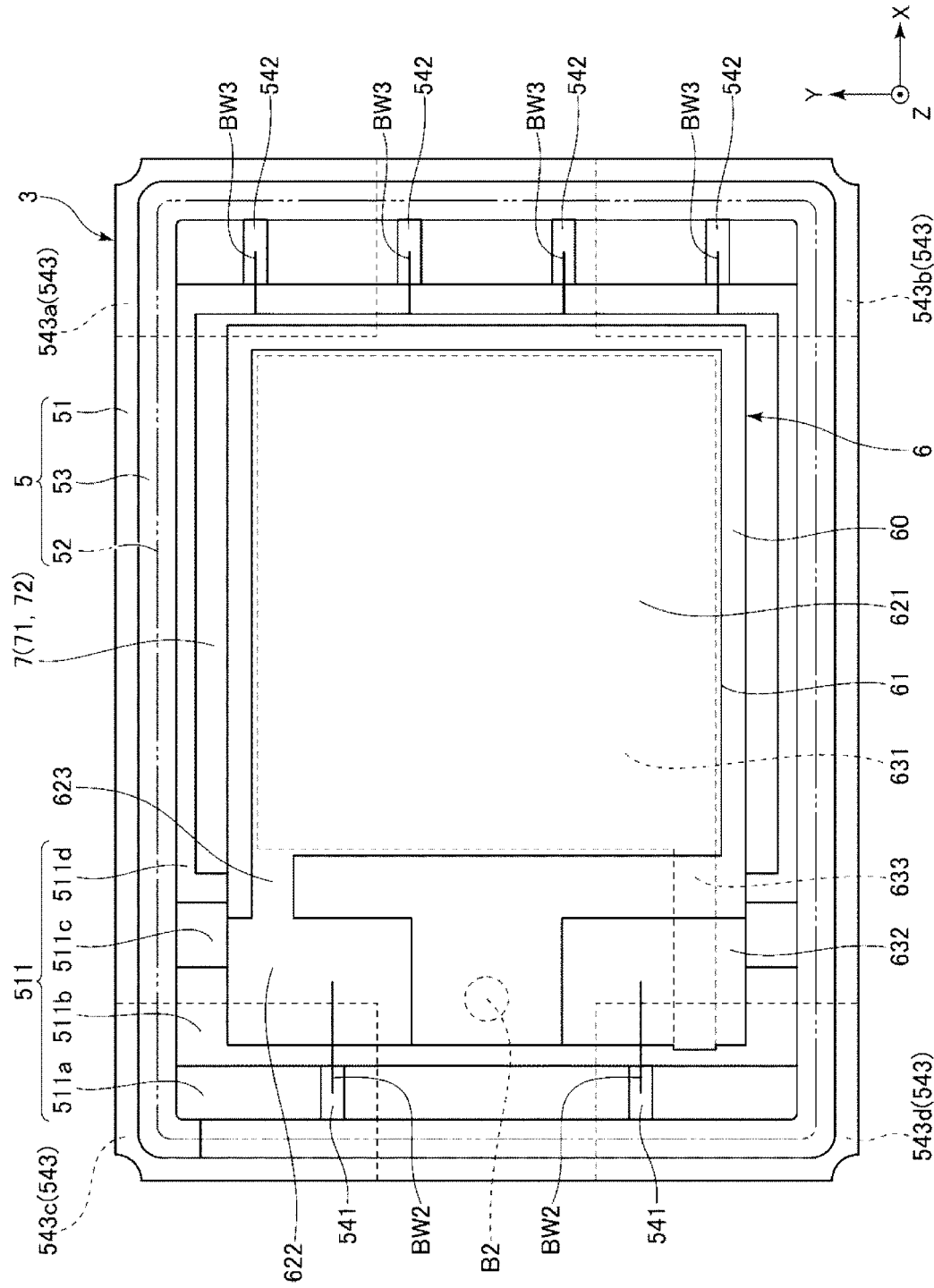
FIG. 3 is a plan view illustrating a temperature compensated crystal oscillator provided in the oscillator in FIG. 1.
Figure 4:
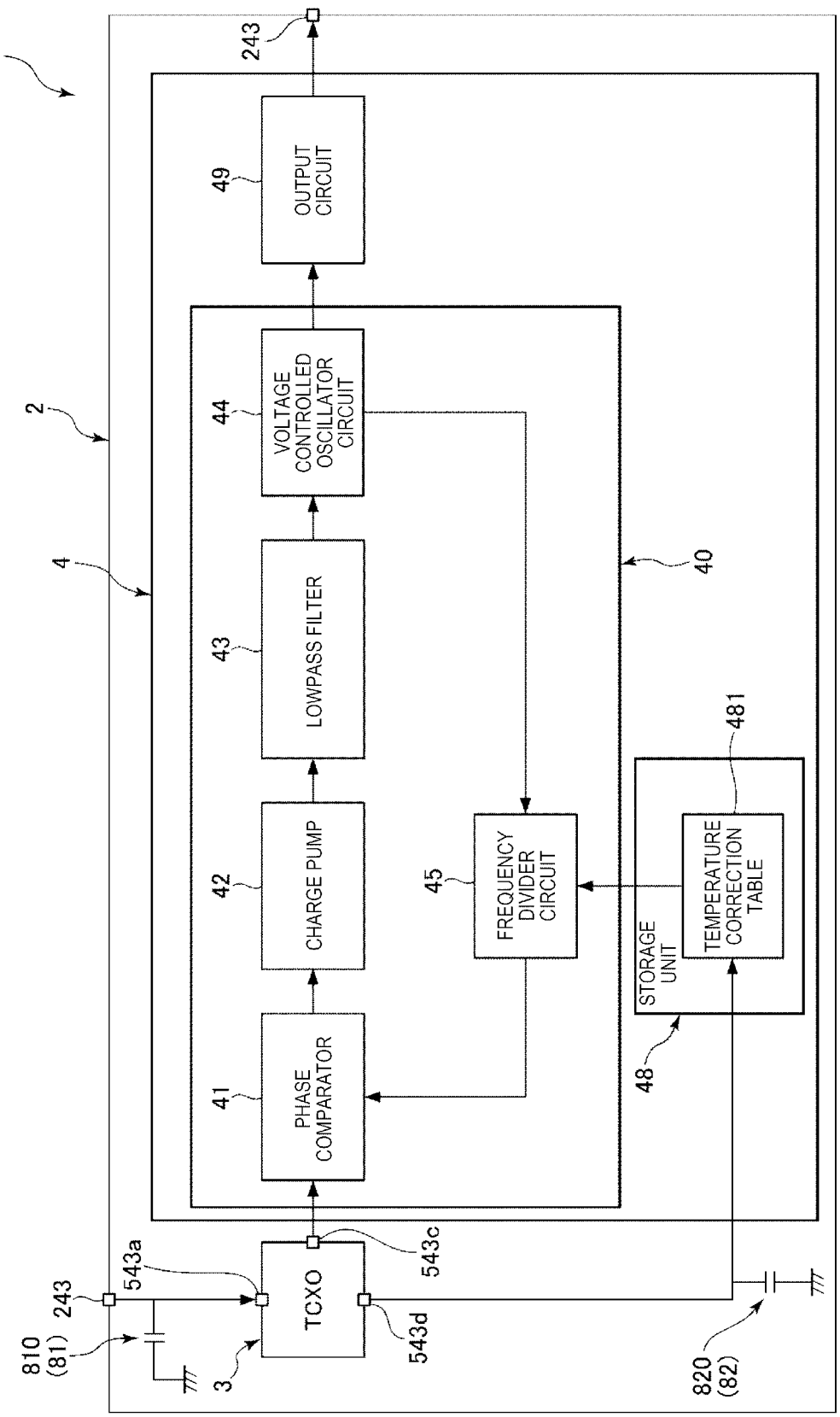
FIG. 4 is a circuit diagram illustrating a second circuit element provided in the oscillator in FIG. 1.

FIG. 1 is a cross-sectional view illustrating an oscillator according to a first embodiment. FIG. 2 is a plan view illustrating the oscillator in FIG. 1. FIG. 3 is a plan view illustrating a temperature compensated crystal oscillator provided in the oscillator in FIG. 1. FIG. 4 is a circuit diagram illustrating a second circuit element provided in the oscillator in FIG. 1. For easy descriptions, in the drawings, an X-axis, a Y-axis, and a Z-axis which are orthogonal to each other are illustrated. In the following descriptions, a positive side in a Z-axis direction is referred to as "up", and a negative side in the Z-axis direction is referred to as "down". The plan view from the Z-axis direction is also simply referred to as "plan view".

As illustrated in FIG. 1, an oscillator 1 includes an outer package 2, a temperature compensated crystal oscillator (TCXO) 3, a second circuit element 4, and discrete components 81 and 82, which are accommodated in the outer package 2. The temperature compensated crystal oscillator 3 includes an inner package 5, a resonator element 6, and a first circuit element 7 which are accommodated in the inner package 5.

The outer package 2 includes a first base substrate 21 and a first lid 22. The first base substrate 21 includes a recess portion 211 opening to an upper surface. The first lid 22 is bonded to the upper surface of the first base substrate 21 through a bonding member 23, so as to close the opening of the recess portion 211. An airtight internal space S2 is formed inside the outer package 2 by the recess portion 211. The temperature compensated crystal oscillator 3 and the first circuit element 7 are accommodated in the internal space S2. Although not particularly limited, the first base substrate 21 may be made of ceramics such as alumina. The first lid 22 may be made of a metal material such as Kovar.

The recess portion 211 is configured by a plurality of recess portions. In the configuration illustrated in FIG. 1, the recess portion 211 includes a recess portion 211a, a recess portion 211b, a recess portion 211c, and a recess portion 211d. The recess portion 211a opens to the upper surface of the first base substrate 21. The recess portion 211b opens to the bottom surface of the recess portion 211a and has an opening smaller than that of the recess portion 211a. The recess portion 211c opens to the bottom surface of the recess portion 211b and has an opening smaller than that of the recess portion 211b. The recess portion 211d opens to the bottom surface of the recess portion 211c and has an opening smaller than that of the recess portion 211c. The configuration of the recess portion 211 is not particularly limited.

The second circuit element 4 is fixed to the bottom surface of the recess portion 211b so as to cover the opening of the recess portion 211c. The temperature compensated crystal oscillator 3 is fixed to the bottom surface of the recess portion 211c so as to cover the opening of the recess portion 211d. The two discrete components 81 and 82 being single circuit components are fixed to the bottom surface of the recess portion 211d. According to such arrangement, it is possible to arrange the second circuit element 4, the temperature compensated crystal oscillator 3, and each of the discrete components 81 and 82 in the outer package 2 to overlap each other in the Z-axis direction, that is, in a height direction of the oscillator 1. Therefore, it is possible to compactly accommodate the second circuit element 4, the temperature compensated crystal oscillator 3, and each of the discrete components 81 and 82 in the outer package 2, and to reduce the size of the oscillator 1.

In particular, in the first embodiment, as illustrated in FIG. 2, in plan view from the Z-axis direction, the entirety of the discrete components 81 and 82 overlaps the temperature compensated crystal oscillator 3, and the entirety of the temperature compensated crystal oscillator 3 overlaps the second circuit element 4. Thus, it is possible to suppress shifts of the temperature compensated crystal oscillator 3, the second circuit element 4, and each of the discrete components 81 and 82 in an X-axis direction and a Y-axis direction. In addition, it is possible to suppress expansion of the outer package 2 in the X-axis direction and a Y-axis direction and to more reduce the size of the oscillator 1. The embodiment is not limited thereto. In plan view from the Z-axis direction, a portion of the discrete components 81 and 82 may protrude from an outer edge of the temperature compensated crystal oscillator 3 to the outside thereof, and a portion of the temperature compensated crystal oscillator 3 may protrude from an outer edge of the second circuit element 4 to the outside thereof.

As illustrated in FIG. 1, a plurality of internal terminals 241 are disposed on the bottom surface of the recess portion 211a. A plurality of internal terminals 242 are disposed on the bottom surface of the recess portion 211c. A plurality of external terminals 243 are disposed on the lower surface of the first base substrate 21. The internal terminals 241 and 242, and the external terminal 243 are electrically coupled to each other through a wiring (not illustrated) formed in the first base substrate 21. Each of the plurality of internal terminals 241 is electrically coupled to the second circuit element 4 through a bonding wire BW1. Each of the plurality of internal terminals 242 is electrically coupled to the temperature compensated crystal oscillator 3 through a conductive bonding member B1.

The atmosphere of the internal space S2 is not particularly limited. For example, preferably, the internal space S2 is in a decompressed state where an air is replaced with an inert gas such as nitrogen or argon, and then is decompressed with respect to the atmospheric pressure. In particular, the internal space S2 is preferably in a vacuum state. Thus, an oscillator 1 in which heat insulation of the outer package 2 is improved, and it is difficult to be affected by an external temperature is obtained. Heat exchange between the inner package 5 and the second circuit element 4, which are accommodated in the outer package 2, in particular, heat exchange by convection is suppressed. Therefore, it is possible to suppress an occurrence of a situation in which the temperature sensor 71 and the resonator element 6 included in the first circuit element 7 is unevenly heated by heat of the second circuit element 4. That is, it is possible to suppress an occurrence of a temperature difference between the resonator element 6 and the temperature sensor 71 by heat of the second circuit element 4. Thus, the oscillator 1 having high accuracy is obtained.

The atmosphere of the internal space S2 is not particularly limited. For example, the internal space S2 may be in an atmospheric pressure state or in a pressurized state. The internal space S2 may be full of an air without replacement with an inert gas such as nitrogen or argon. The internal space S2 may not be airtight and communicate with the outside of the outer package 2.

As illustrated in FIG. 1, the temperature compensated crystal oscillator 3 includes the inner package 5 mounted on the first base substrate 21, and the resonator element 6 and the first circuit element 7 which are accommodated in the inner package 5. The inner package 5 includes a second base substrate 51 and a second lid 52. The second base substrate 51 includes a recess portion 511 opening to an upper surface. The second lid 52 is bonded to the upper surface of the second base substrate 51 through a bonding member 53, so as to close the opening of the recess portion 511. An internal space S5 which is airtight by the recess portion 511 is formed in the inner package 5. The resonator element 6 and the first circuit element 7 are accommodated in the internal space S5. Although not particularly limited, the second base substrate 51 may be made of ceramics such as alumina. The second lid 52 may be made of a metal material such as Kovar.

The recess portion 511 is configured by a plurality of recess portions. In the configuration illustrated in FIG. 1, the recess portion 511 includes a recess portion 511a, a recess portion 511b, a recess portion 511c, and a recess portion 511d. The recess portion 511a opens to the upper surface of the second base substrate 51. The recess portion 511b opens to the bottom surface of the recess portion 511a and has an opening smaller than that of the recess portion 511a. The recess portion 511c opens to the bottom surface of the recess portion 511b and has an opening smaller than that of the recess portion 511b. The recess portion 511d opens to the bottom surface of the recess portion 511c and has an opening smaller than that of the recess portion 511c. The configuration of the recess portion 511 is not particularly limited.

The resonator element 6 is fixed to the bottom surface of the recess portion 511b. The first circuit element 7 is fixed to the bottom surface of the recess portion 511d. According to such arrangement, it is possible to arrange the resonator element 6 and the first circuit element 7 in the inner package 5 to overlap each other in the Z-axis direction, that is, in the height direction of the oscillator 1. Therefore, it is possible to compactly accommodate the resonator element 6 and the first circuit element 7 in the inner package 5, and thus to reduce the size of the temperature compensated crystal oscillator 3 and to reduce the size of the oscillator 1. The arrangement of the resonator element 6 is not limited to the above description, and the resonator element 6 may be fixed to the upper surface of the first circuit element 7.

A plurality of internal terminals 541 are disposed on the bottom surface of the recess portion 511a. A plurality of internal terminals 542 are disposed on the bottom surface of the recess portion 511c. A plurality of external terminals 543 are disposed on the lower surface of the second base substrate 51. The internal terminals 541 and 542, and the external terminal 543 are electrically coupled to each other through a wiring (not illustrated) formed in the second base substrate 51. Each of the plurality of internal terminals 541 is electrically coupled to the resonator element 6 through a bonding wire BW2. Each of the plurality of internal terminals 542 is electrically coupled to the first circuit element 7 through a bonding wire BW3. A method of coupling the resonator element 6 and the internal terminal 541 and a method of coupling the first circuit element 7 and the internal terminal 542 are not particularly limited.

The atmosphere of the internal space S5 is not particularly limited. For example, preferably, the internal space S5 is in a decompressed state where an air is replaced with an inert gas such as nitrogen or argon, and then is decompressed with respect to the atmospheric pressure. In particular, the internal space S5 is preferably in a vacuum state. Thus, viscous resistance decreases and it is possible to resonate the resonator element 6 with high efficiency. The atmosphere of the internal space S5 is not particularly limited. The internal space S5 may be in an atmospheric pressure state or in a pressurized state. Thus, heat transfer by convection is likely to occur in the internal space S5. Accordingly, it is possible to more reduce a temperature difference between the resonator element 6 and a temperature sensor 71 (described later). In addition, accuracy when the temperature sensor 71 detects the temperature of the resonator element 6 is improved. The internal space S5 may be full of an air without replacement with an inert gas such as nitrogen or argon. The internal space S5 may not be airtight, but communicate with the internal space S2.

The resonator element 6 is an AT cut quartz crystal resonator element. The AT cut quartz crystal resonator element has third-order frequency temperature characteristics and thus is excellent in frequency stability. As illustrated in FIG. 3, the resonator element 6 includes a rectangular quartz crystal substrate 60 cut out by AT cut, and an electrode 61 disposed on the surface of the quartz crystal substrate 60. The electrode 61 includes a first excitation electrode 621 and a second excitation electrode 631. The first excitation electrode 621 is disposed on the upper surface of the quartz crystal substrate 60. The second excitation electrode 631 is disposed on the lower surface of the quartz crystal substrate 60 and faces the first excitation electrode 621 with the quartz crystal substrate 60 interposed between the excitation electrodes. The electrode 61 includes a first pad electrode 622, a second pad electrode 632, a first lead electrode 623, and a second lead electrode 633. The first pad electrode 622 and the second pad electrode 632 are arranged at an edge portion of the upper surface of the quartz crystal substrate 60. The first lead electrode 623 electrically couples the first excitation electrode 621 and the first pad electrode 622 to each other. The second lead electrode 633 electrically couples the second excitation electrode 631 and the second pad electrode 632 to each other.

One end portion of such a resonator element 6 is bonded to the bottom surface of the recess portion 511b through a bonding member B2. Each of the first pad electrode 622 and the second pad electrode 632 is electrically coupled to the internal terminal 541 through the bonding wire BW2. The first pad electrode 622 and the second pad electrode 632 may be electrically coupled to the inner package 5 through a conductive adhesive instead of the bonding wire. The bonding member B2 is not particularly limited. As the bonding member B2, for example, a conductive bonding member represented by a metal bump, solder, a brazing material, a metal paste, or a conductive resin adhesive may be provided, or an insulating bonding member represented by various resin adhesives of epoxy series, silicone series, or polyimide series may be provided. The bonding member B2 is preferably the conductive bonding member.

The conductive bonding member contains a metal material. Thus, the conductive bonding member has a thermal conductivity higher than that of an insulating bonding member which is represented by a resin adhesive and does not contain a metal material. Therefore, the resonator element 6 and the first circuit element 7 are easily thermally joined to each other through the bonding member B2 and the second base substrate 51, and thus it is possible to more reduce the temperature difference between the resonator element 6 and the first circuit element 7. Thus, it is possible to detect the temperature of the resonator element 6 by the temperature sensor 71 with high accuracy.

The configuration of the resonator element 6 is not particularly limited. For example, the shape of the quartz crystal substrate 60 in plan view is not limited to a rectangle. In addition to the AT cut quartz crystal resonator element, a SC cut quartz crystal resonator element, a BT cut quartz crystal resonator element, a tuning fork type resonator element, a surface acoustic wave resonator, other piezoelectric resonator elements, a micro-electromechanical system (MEMS) resonator element, and the like may be used as the resonator element 6.

Instead of the quartz crystal substrate, for example, various piezoelectric substrates made of lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbPO_3$), sodium potassium niobate ($(K, Na)NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$) may be used. For example, a substrate such as a silicon substrate other than the piezoelectric substrate may be used.

As illustrated in FIGS. 1 and 3, the first circuit element 7 includes the temperature sensor 71 and the oscillation circuit 72. The oscillation circuit 72 has a function to causes the resonator element 6 to oscillate and to generate an oscillation signal subjected to temperature compensation based on the detected temperature of the temperature sensor 71. That is, the oscillation circuit 72 includes an oscillation circuit unit 721 and a temperature compensation circuit unit 722. The oscillation circuit unit 721 is electrically coupled to the resonator element 6, amplifies an output signal of the resonator element 6, and feeds the amplified signal back to the resonator element 6, and thereby causes the resonator element 6 to oscillate. The temperature compensation circuit unit 722 performs temperature compensation based on temperature information output from the temperature sensor 71 such that frequency fluctuation of the output signal occurs smaller than the frequency temperature characteristics of the resonator element 6 itself. As the oscillation circuit 72, for example, an oscillation circuit such as a Pierce oscillation circuit, an inverter type oscillation circuit, a Colpitts oscillation circuit, and a Hartley oscillation circuit may be used.

For example, the temperature compensation circuit unit 722 in the oscillation circuit 72 may adjust the capacitance of a variable capacitance circuit coupled to the oscillation circuit unit 721 to adjust an oscillation frequency of the oscillation circuit unit 721. The frequency of the output signal of the oscillation circuit unit 721 may be adjusted by a PLL circuit or a direct digital synthesizer circuit.

As described above, the temperature sensor 71 and the resonator element 6 are accommodated together in the inner package 5, and thus it is possible to dispose the temperature sensor 71 in the same space as that for the resonator element 6 and near the resonator element 6. Therefore, it is possible to detect the temperature of the resonator element 6 by the temperature sensor 71 with higher accuracy, and thus temperature compensation by the oscillation circuit 72 becomes more accurate.

In the embodiment, the temperature sensor 71 is configured by an IC temperature sensor and is mounted in the first circuit element 7. However, the embodiment is not limited thereto. That is, the temperature sensor 71 may be a discrete component which is provided to be separate from the first circuit element 7. In this case, the temperature sensor 71 may be configured with a thermistor or a thermocouple, for example. The disposition of the temperature sensor 71 is not particularly limited so long as the temperature sensor 71 is in the internal space S5 and is capable of detecting the temperature of the resonator element 6. For example, the temperature sensor 71 may be disposed on the upper surface of the second base substrate 51 or the first circuit element 7.

The temperature compensated crystal oscillator 3 is described above. The temperature compensated crystal oscillator 3 includes four external terminals 543 described above. As illustrated in FIG. 3, among the external terminals, one external is a terminal 543a for a power supply voltage of the first circuit element 7. One terminal is a ground terminal 543b for the power supply voltage. One terminal is a terminal 543c for an oscillation signal output from the oscillation circuit 72. One terminal is a terminal 543d for an output signal of the temperature sensor 71. The number of external terminals 543 or the purpose thereof is not particularly limited.

As described above, as illustrated in FIG. 1, in the temperature compensated crystal oscillator 3, the lower surface of the second base substrate 51 is disposed to be directed toward the bottom surface of the recess portion 211c, and the lower surface of the second base substrate 51 is fixed to the bottom surface of the recess portion 211c through the bonding member B1. Each of the external terminals 543 is electrically coupled to the internal terminal 242 through the bonding member B1. The bonding member B1 is not particularly limited. For example, a metal bump, solder, a brazing material, a metal paste, and a conductive resin adhesive may be used as the bonding member B1.

As illustrated in FIG. 1, the second circuit element 4 is accommodated in the outer package 2 in a state of being mounted on the first base substrate 21. That is, in the second circuit element 4, an outer circumferential portion of the lower surface is bonded to the bottom surface of the recess portion 211b through the bonding member B3. The bonding member B3 is not particularly limited. For example, a metal bump, solder, a brazing material, a metal paste, and a conductive resin adhesive may be used as the bonding member B3. The bonding member B3 may be a material such as an resin adhesive, which has an insulating property.

As described above, as illustrated in FIG. 4, the second circuit element 4 includes a decimal frequency division type PLL circuit (phase synchronization circuit) 40, a storage unit 48, and an output circuit 49. The PLL circuit 40 functions as a frequency control circuit that controls the frequency of the oscillation signal output from the oscillation circuit 72 and further corrects frequency temperature characteristics remaining in the oscillation signal output by the temperature compensated crystal oscillator 3. The storage unit 48 stores a temperature correction table 481. In the embodiment, the PLL circuit 40, the storage unit 48, and the output circuit 49 are configured as a one-chip circuit element. However, the PLL circuit 40, the storage unit 48, and the output circuit 49 may be configured by a plurality of chip circuit elements, or some thereof may be configured by discrete components.

The PLL circuit 40 includes a phase comparator 41, a charge pump 42, a lowpass filter 43, a voltage controlled oscillator circuit 44, and a frequency divider circuit 45. The phase comparator 41 compares the phase of an oscillation signal output by the oscillation circuit 72 to the phase of a clock signal output by the frequency divider circuit 45, and outputs a comparison result in a form of a pulse voltage. The charge pump 42 converts the pulse voltage output by the phase comparator 41 into a current. The lowpass filter 43 smoothens the current output by the charge pump 42 and converts the current into a voltage.

The voltage controlled oscillator circuit 44 sets an output voltage of the lowpass filter 43 to a control voltage and outputs a signal having a frequency changing in accordance with the control voltage. In the embodiment, the voltage controlled oscillator circuit 44 is an LC oscillation circuit configured using an inductance element such as a coil and a capacitance element such as a capacitor. However, the embodiment is not limited thereto, and an oscillation circuit using a piezoelectric resonator such as a quartz crystal resonator may be used. The frequency divider circuit 45 outputs a clock signal obtained by performing decimal frequency division of a clock signal output by the voltage controlled oscillator circuit 44 at a division ratio determined from the output signal of the temperature sensor 71 and the temperature correction table 481. The division ratio of the frequency divider circuit 45 is not limited to a configuration in which the division ratio is determined by the temperature correction table 481. For example, the division ratio may be determined by a polynomial operation, or may be determined by a neural network operation based on a learned model obtained by performing machine learning.

The clock signal output by the PLL circuit 40 is input to the output circuit 49, and the output circuit 49 generates an oscillation signal having amplitude which is adjusted to a desired level. The oscillation signal generated by the output circuit 49 is output to the outside of the oscillator 1 through the external terminal 243 of the oscillator 1.

As described above, since the frequency temperature characteristics remaining in the oscillation signal output by the temperature compensated crystal oscillator 3 are further corrected by the PLL circuit 40, an oscillator 1 in which frequency deviation occurring by the temperature is smaller is obtained. The PLL circuit 40 is not particularly limited. For example, the PLL circuit 40 may include an integer frequency division type PLL circuit that is disposed between the oscillation circuit 72 and the phase comparator 41 and divides the oscillation signal output by the oscillation circuit 72 at an integer division ratio. The PLL circuit 40 is not limited to a component that further performs temperature compensation on the output signal of the temperature compensated crystal oscillator 3. For example, in order to obtain a desired frequency signal, a configuration in which the PLL circuit 40 multiplies an output frequency of the temperature compensated crystal oscillator 3 by a fixed value may be made.

As illustrated in FIG. 1, the second circuit element 4 having the above-described configuration is mounted on the first base substrate 21 along with the inner package 5 of the temperature compensated crystal oscillator 3 and is accommodated in the outer package 2. However, the second circuit element 4 and the inner package 5 are disposed to be spaced from each other in the Z-axis direction. That is, a space G is formed between the second circuit element 4 and the inner package 5, and thus the second circuit element 4 and the inner package 5 are not in contact with each other. Thus, in comparison to a case where the second circuit element 4 and the inner package 5 are in contact with each other, it is difficult to transfer heat of the second circuit element 4 to the temperature compensated crystal oscillator 3. Thus, it is possible to effectively suppress an occurrence of a temperature difference between the resonator element 6 and the temperature sensor 71 by heat of the second circuit element 4. Thus, it is possible to detect the temperature of the resonator element 6 by the temperature sensor 71 with higher accuracy. In particular, in the embodiment, the second circuit element 4 includes the PLL circuit 40, and the PLL circuit 40 has relatively large power consumption and easily generates heat. Accordingly, it is possible to significantly exhibit the above-described effects by forming the space G between the second circuit element 4 and the inner package 5. Since the second circuit element 4 also operates based on a temperature information signal output by the temperature sensor 71, it is difficult to receive an influence of heat generation in comparison to a case of providing the temperature sensor in the second circuit element 4.

The width of the space G, that is, a distance D between the second circuit element 4 and the inner package 5 is not particularly limited. For example, the distance D is preferably 0.01 mm to 0.1 mm, and more preferably 0.03 mm to 0.009 mm. Thus, it is possible to sufficiently suppress the occurrence of a temperature difference between the resonator element 6 and the temperature sensor 71 by heat of the second circuit element 4, while avoiding an excessive increase in size of the oscillator 1. In the embodiment, the second circuit element 4 and the inner package 5 are mounted together on the first base substrate 21. Thus, if the depth of the recess portion 211c formed in the first base substrate 21 is appropriately determined, it is possible to set the distance D to be a desired value as described above. In order to adjust the distance D, a spacer (not illustrated) may be used.

The second circuit element 4 is located above the temperature compensated crystal oscillator 3, and is located between the temperature compensated crystal oscillator 3 and the first lid 22. As described above, the lower surface of the inner package 5 of the temperature compensated crystal oscillator 3 is fixed to the bottom surface of the recess portion 211c. Thus, the second circuit element 4 is located on a side of the inner package 5, which is opposite to a side thereof bonded to the first base substrate 21. According to such arrangement, it is possible to set a heat transfer path between a bonding portion of the second circuit element 4 and the first base substrate 21 and a bonding portion of the inner package 5 and the first base substrate 21 to be sufficiently long. Therefore, it is difficult to transfer heat of the second circuit element 4 to the inner package 5 through the first base substrate 21. Thus, it is possible to effectively suppress the occurrence of a temperature difference between the resonator element 6 and the temperature sensor 71 by heat of the second circuit element 4.

As described above, the discrete components 81 and 82 are accommodated in the outer package 2 and are bonded to the bottom surface of the recess portion 211*d*. The discrete components 81 and 82 correspond to bypass capacitors 810 and 820, respectively. As illustrated in FIG. 4, the bypass capacitor 810 is coupled to the terminal 543*a* between the external terminal 243 provided in the outer package 2 and the terminal 543*a* for the power supply voltage, which is provided in the inner package 5. Thus, it is possible to remove noise from the power supply voltage supplied through the external terminal 243 and to supply the stable power supply voltage to the first circuit element 7.

The bypass capacitor 820 is coupled to the terminal 543*d* between the terminal 543*d* for the output signal of the temperature sensor 71 and the PLL circuit 40. Thus, it is possible to remove noise from the output signal of the temperature sensor 71 and to supply the more accurate output signal to the PLL circuit 40. Therefore, it is possible to determine the division ratio by the frequency divider circuit 45 with higher accuracy. The discrete components 81 and 82 are not limited to the bypass capacitors 810 and 820. For example, thermistors, resistors, or diodes may be provided. At least one of the discrete components 81 and 82 may be omitted, and another discrete component may be added. The bypass capacitors 810 and 820 may be mounted in the second circuit element 4.

The oscillator 1 is described above. As described above, the oscillator 1 includes the outer package 2 as the first container, the inner package 5 as the second container, which is accommodated in the outer package 2, the resonator element 6 accommodated in the inner package 5, the temperature sensor 71 accommodated in the inner package 5, the first circuit element 7 which is accommodated in the inner package 5, causes the resonator element 6 to oscillate, and includes the oscillation circuit 72 that generates an oscillation signal subjected to temperature compensation based on the detected temperature of the temperature sensor 71, and the second circuit element 4 which is accommodated in the outer package 2 and includes the PLL circuit 40 as the frequency control circuit, that controls the frequency of the oscillation signal output from the oscillation circuit 72. The inner package 5 and the second circuit element 4 are spaced from each other and are disposed to overlap each other in plan view.

According to such a configuration, since the temperature sensor 71 and the resonator element 6 are accommodated together in the inner package 5, it is possible to dispose the temperature sensor 71 in the same space as that for the resonator element 6 and near the resonator element 6. Since the inner package 5 and the second circuit element 4 are disposed to be spaced from each other, heat exchange between the inner package 5 and the second circuit element 4 is suppressed, and thus it is possible to suppress an occurrence of a situation in which the temperature sensor 71 and the resonator element 6 are unevenly heated. Therefore, it is possible to effectively suppress an occurrence of a situation in which a temperature difference occurs between the resonator element 6 and the temperature sensor 71, or the temperature difference fluctuates. As a result, it is possible to detect the temperature of the resonator element 6 by the temperature sensor 71 with higher accuracy, and thus temperature compensation by the oscillation circuit 72 becomes more accurate. It is possible to output an oscillation signal having small frequency deviation, from the PLL circuit 40. Accordingly, the oscillator 1 capable of outputting a frequency signal having high accuracy is obtained.

Since the inner package 5 and the second circuit element 4 are disposed to overlap each other in the Z-axis direction, expansion of the outer package 2 in the X-axis direction and the Y-axis direction is suppressed, and it is possible to reduce the size of the oscillator 1.

As described above, the outer package 2 includes the first base substrate 21 including the recess portion 211 and the first lid 22 bonded to the first base substrate 21 so as to close the opening of the recess portion 211. The inner package 5 is disposed in the recess portion 211. The second circuit element 4 is disposed between the inner package 5 and the first lid 22. Thus, it is possible to set a heat transfer path between the bonding portion of the second circuit element 4 and the first base substrate 21 and the bonding portion of the inner package 5 and the first base substrate 21 to be sufficiently long. Therefore, it is difficult to transfer heat of the second circuit element 4 to the inner package 5 through the first base substrate 21. Thus, it is possible to suppress the temperature difference between the resonator element 6 and the temperature sensor 71 to be smaller.

As described above, the recess portion 211 includes the recess portion 211*b* as the first recess portion and the recess portion 211*c* as the second recess portion, which opens to the bottom surface of the recess portion 211*b*. The inner package 5 is bonded to the bottom surface of the recess portion 211*c*. The second circuit element 4 is bonded to the bottom surface of the recess portion 211*b*. The second circuit element 4 overlaps the recess portion 211*b* in plan view. In other words, the second circuit element 4 is bonded to the bottom surface of the recess portion 211*b* so as to close at least a portion of the opening of the recess portion 211*c*. According to such arrangement, it is possible to more reliably arrange the inner package 5 and the second circuit element 4 to overlap each other in the Z-axis direction. It is possible to simply control the size of the space G between the second circuit element 4 and the inner package 5 by adjusting the depth of the recess portion 211*c*.

As described above, the recess portion 211 includes the recess portion 211*d* as the third recess portion, which opens to the bottom surface of the recess portion 211*c*. The oscillator 1 includes the bypass capacitors 810 and 820 disposed in the recess portion 211*d*. According to such arrangement, it is possible to arrange the bypass capacitors 810 and 820, the inner package 5, and the second circuit element 4 to overlap each other in the Z-axis direction. Thus, it is possible to reduce the size of the oscillator 1.

As described above, the inner package 5 includes the terminal 543*a* as a power supply terminal, to which the power supply voltage for the oscillation circuit 72 is applied. The bypass capacitor 810 is coupled to the terminal 543*a*. Thus, it is possible to remove noise by the bypass capacitor 810 and to supply the stable power supply voltage to the oscillation circuit 72.

As described above, the inner package 5 includes the terminal 543*d* as a temperature output terminal, from which the output signal of the temperature sensor 71 is output. The terminal 543*d* is electrically coupled to the PLL circuit 40. Thus, it is possible to feed the temperature information obtained by detection of the temperature sensor 71 back to the PLL circuit 40 and to output a frequency signal having higher accuracy from the PLL circuit 40.

As described above, the outer package 2 is decompressed with respect to the atmospheric pressure. Thus, heat exchange between the inner package 5 and the second circuit element 4, in particular, heat exchange by convection is suppressed. Thus, it is possible to suppress an occurrence of a situation in which the temperature sensor 71 and the resonator element 6 are unevenly heated by the heat of the second circuit element 4. That is, it is possible to effectively suppress the occurrence of the excessive temperature difference between the resonator element 6 and the temperature sensor 71 by heat of the second circuit element 4.

Second Embodiment

Figure 5:
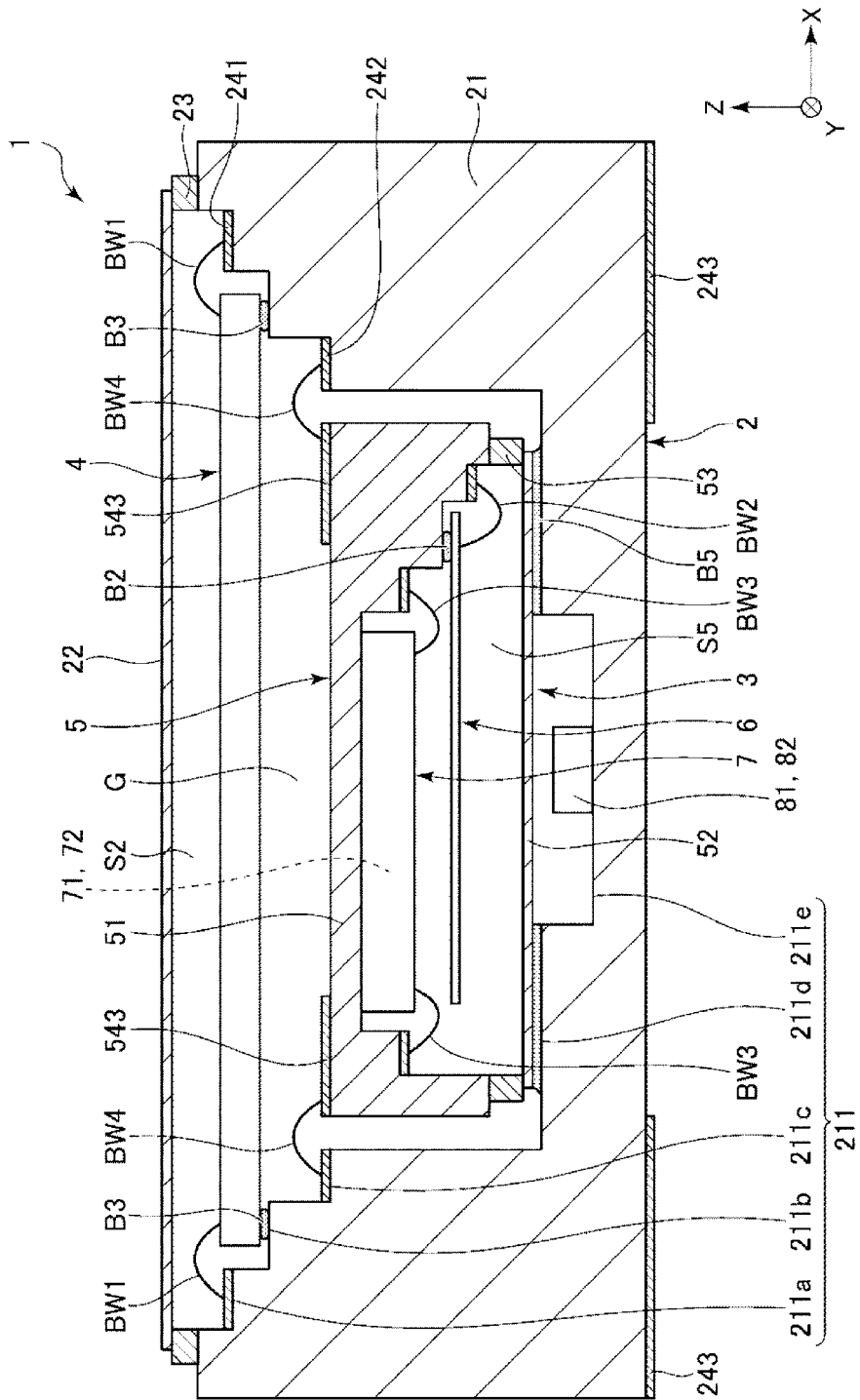
FIG. 5 is a cross-sectional view illustrating an oscillator according to a second embodiment.

FIG. 5 is a cross-sectional view illustrating an oscillator according to a second embodiment.

The second embodiment is similar to the above-described first embodiment except that the posture of the temperature compensated crystal oscillator 3 is different. In the following descriptions, descriptions for the second embodiment will be made focusing on a difference from the above-described embodiment, and descriptions of the similar items will not be repeated. In FIG. 5, components similar to those in the above-described embodiment are denoted by the same reference signs.

As illustrated in FIG. 5, in the oscillator 1 in the second embodiment, the recess portion 211 in the outer package 2 includes the recess portion 211a opening to the upper surface of the first base substrate 21, the recess portion 211b opening to the bottom surface of the recess portion 211a, the recess portion 211c opening to the bottom surface of the recess portion 211b, the recess portion 211d opening to the bottom surface of the recess portion 211c, and the recess portion 211e opening to the bottom surface of the recess portion 211d. The second circuit element 4 is fixed to the bottom surface of the recess portion 211b. The temperature compensated crystal oscillator 3 is fixed to the bottom surface of the recess portion 211d. The discrete components 81 and 82 are fixed to the bottom surface of the recess portion 211e. The plurality of internal terminals 241 are disposed on the bottom surface of the recess portion 211a. The plurality of internal terminals 242 are disposed on the bottom surface of the recess portion 211c.

The temperature compensated crystal oscillator 3 is disposed at an upside down posture of that in the above-described first embodiment, that is, at a posture in which the second lid 52 is directed toward the bottom surface of the recess portion 211d. The second lid 52 is fixed to the bottom surface of the recess portion 211d through a bonding member B5. Each of the four external terminals 543 disposed on the second base substrate 51 is electrically coupled to the internal terminal 242 through a bonding wire BW4.

Since the temperature compensated crystal oscillator 3 is disposed at such a posture, it is possible to set the heat transfer path from the bonding portion of the inner package 5 and the first base substrate 21 to the resonator element 6 and the first circuit element 7 to be longer than, for example, the heat transfer path when the second base substrate 51 is fixed to the first base substrate 21 through the bonding member B1 as described in the first embodiment. Therefore, in comparison to the above-described first embodiment, it is difficult to transfer heat of the second circuit element 4 to the resonator element 6 and the first circuit element 7. As a result, it is possible to suppress the temperature difference between the resonator element 6 and the temperature sensor 71 to be smaller.

As described above, in the oscillator 1 in the second embodiment, the inner package 5 includes the second base substrate 51 to which the resonator element 6 is fixed, and the second lid 52 bonded to the second base substrate 51 so as to accommodate the resonator element 6 between the second lid 52 and the second base substrate 51. The second lid is bonded to the first base substrate 21 through the bonding member B5. Thus, it is more difficult to transfer the heat of the second circuit element 4 to the resonator element 6 and the first circuit element 7. As a result, it is possible to suppress the temperature difference between the resonator element 6 and the temperature sensor 71 to be smaller.

Third Embodiment

Figure 6:
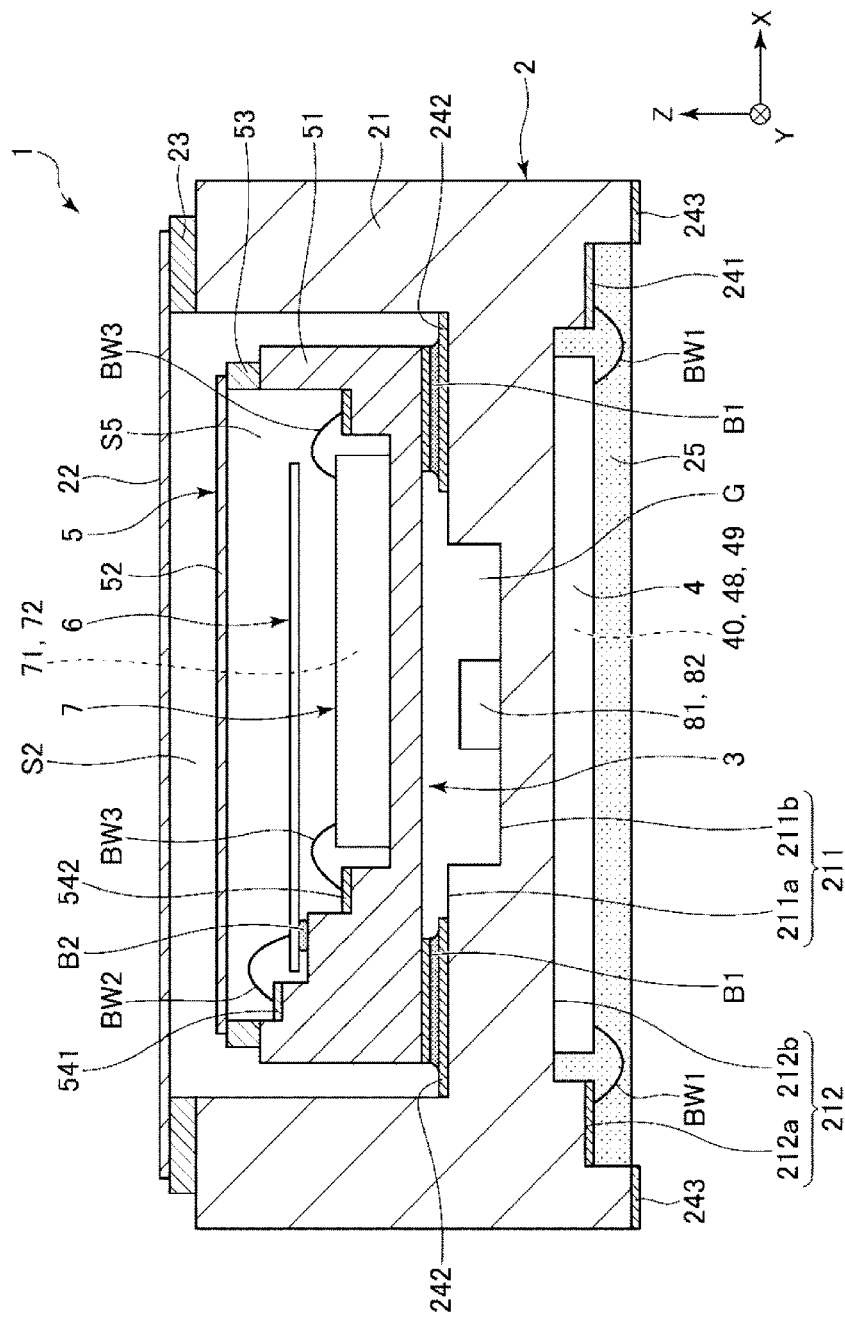
FIG. 6 is a cross-sectional view illustrating an oscillator according to a third embodiment.

FIG. 6 is a cross-sectional view illustrating an oscillator according to a third embodiment.

The third embodiment is similar to the above-described first embodiment except that the disposition of the second circuit element 4 is different. In the following descriptions, descriptions for the second embodiment will be made focusing on a difference from the above-described embodiment, and descriptions of the similar items will not be repeated. In FIG. 6, components similar to those in the above-described embodiment are denoted by the same reference signs.

As illustrated in FIG. 6, in the oscillator 1 in the third embodiment, the second circuit element 4 is disposed outside the outer package 2, that is, outside the internal space S2. Specific descriptions will be made below.

The first base substrate 21 includes the recess portion 212 opening to the lower surface of the first base substrate. The recess portion 212 includes the plurality of recess portions. In the configuration in FIG. 6, the recess portion 212 includes the recess portion 212a opening to the lower surface of the first base substrate 21 and the recess portion 212b which opens to the bottom surface of the recess portion 212a and has an opening smaller than the recess portion 212a. The second circuit element 4 is fixed to the bottom surface of the recess portion 212b. The plurality of internal terminals 241 are provided on the bottom surface of the recess portion 212a. The internal terminals 241 and the second circuit element 4 are electrically coupled to each other through the bonding wire BW1.

A mold portion 25 that covers the second circuit element 4 is disposed at the recess portion 212, and thus the second circuit element 4 is protected from moisture, dust, dirt, an impact, and the like. The mold portion 25 may be omitted. At this time, for example, a lid may be prepared, and the lid may be bonded to the lower surface of the first base substrate 21 so as to cover the opening of the recess portion 212. Thus, the internal space for accommodating the second circuit element 4 is formed, and thus it is possible to suitably protect the second circuit element 4.

The recess portion 211 of the first base substrate 21 includes the recess portion 211a opening to the upper surface of the first base substrate 21, and the recess portion 211b which opens to the bottom surface of the recess portion 211a and has an opening smaller than the recess portion 211a. The temperature compensated crystal oscillator 3 is fixed to the bottom surface of the recess portion 211a. The discrete components 81 and 82 are fixed to the bottom surface of the recess portion 211b.

As described above, the second circuit element 4 is disposed on the outside of the outer package 2, and the temperature compensated crystal oscillator 3 is disposed on the inner side of the outer package 2. Thus, it is possible to arrange the second circuit element 4 and the temperature compensated crystal oscillator 3 in different spaces, so as to be separated from each other. Therefore, it is possible to more effectively suppress transfer of heat of the second circuit element 4 to the temperature compensated crystal oscillator 3 by convection or radiation. Therefore, it is possible to suppress the temperature difference between the resonator element 6 and the temperature sensor 71 and to obtain the oscillator 1 capable of outputting the frequency signal with higher accuracy.

Even in the third embodiment, similar to the above-described first embodiment, the second circuit element 4, the temperature compensated crystal oscillator 3, and each of the discrete components 81 and 82 are disposed to overlap each other in plan view. Therefore, it is possible to suppress expansion of the outer package 2 in the X-axis direction and the Y-axis direction and to reduce the size of the oscillator 1.

As described above, the oscillator 1 in the third embodiment includes the outer package 2 as the first container, the inner package 5 as the second container disposed in the internal space S2, the resonator element 6 accommodated in the inner package 5, the temperature sensor 71 accommodated in the inner package 5, the first circuit element 7, and the second circuit element 4. The outer package 2 includes the first base substrate 21 as the base substrate and the first lid 22 as the lid, which is bonded to the upper surface (one main surface) of the first base substrate 21, and has the internal space S2. The first circuit element 7 is accommodated in the inner package 5, causes the resonator element 6 to oscillate, and includes the oscillation circuit 72 that generates an oscillation signal subjected to temperature compensation based on the detected temperature of the temperature sensor 71. The second circuit element 4 is disposed on the lower surface (the other main surface) of the first base substrate 21 and includes the PLL circuit 40 as the frequency control circuit that controls the frequency of the oscillation signal from the oscillation circuit 72. The inner package 5 and the second circuit element 4 are spaced from each other and are disposed to overlap each other in plan view.

According to such a configuration, since the temperature sensor 71 and the resonator element 6 are accommodated together in the inner package 5, it is possible to dispose the temperature sensor 71 in the same space as that for the resonator element 6 and near the resonator element 6. Since the inner package 5 and the second circuit element 4 are disposed to be spaced from each other, heat exchange between the inner package 5 and the second circuit element 4 is suppressed, and thus it is possible to suppress an occurrence of a situation in which the temperature sensor 71 and the resonator element 6 are unevenly heated. Therefore, it is possible to effectively suppress the occurrence of a temperature difference between the resonator element 6 and the temperature sensor 71 by heat of the second circuit element 4. Therefore, it is possible to detect the temperature of the resonator element 6 by the temperature sensor 71 with higher accuracy, and thus temperature compensation by the oscillation circuit 72 becomes more accurate. Accordingly, the oscillator 1 capable of outputting a frequency signal having high accuracy is obtained.

Since the inner package 5 and the second circuit element 4 are disposed to overlap each other in the Z-axis direction, expansion of the outer package 2 in the X-axis direction and the Y-axis direction is suppressed, and it is possible to reduce the size of the oscillator 1.

Fourth Embodiment

Figure 7:
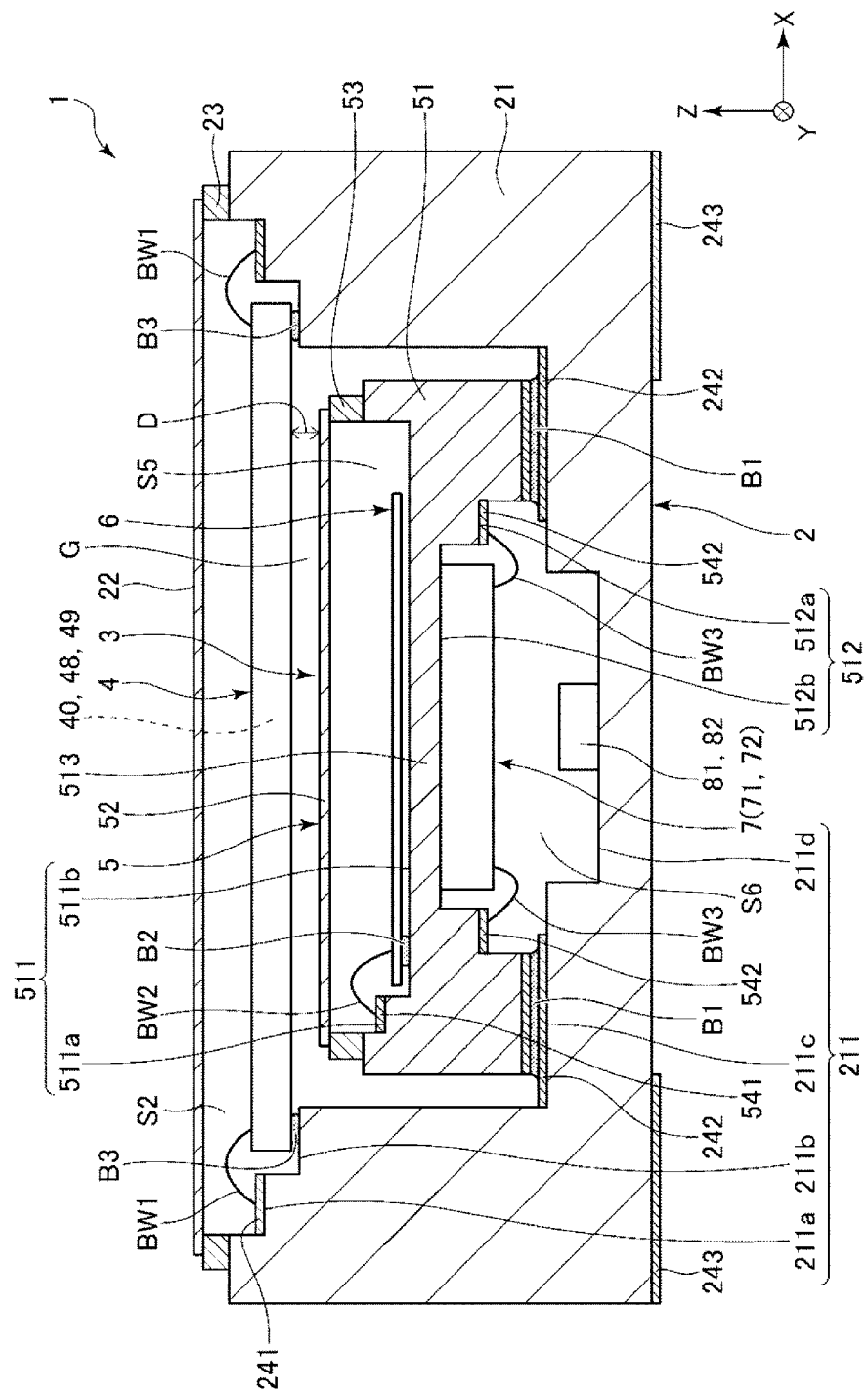
FIG. 7 is a cross-sectional view illustrating an oscillator according to a fourth embodiment.

FIG. 7 is a cross-sectional view illustrating an oscillator according to a fourth embodiment.

The fourth embodiment is similar to the above-described first embodiment except that the configuration of the temperature compensated crystal oscillator 3 is different. In the following descriptions, descriptions for the second embodiment will be made focusing on a difference from the above-described embodiment, and descriptions of the similar items will not be repeated. In FIG. 7, components similar to those in the above-described embodiment are denoted by the same reference signs.

As illustrated in FIG. 7, in the oscillator 1 in the third embodiment, the first circuit element 7 is disposed outside the inner package 5, that is, outside the internal space S5. Specific descriptions will be made below.

The second base substrate 51 includes the recess portion 512 opening to the lower surface of the second base substrate. The recess portion 512 includes the plurality of recess portions. In the configuration in FIG. 7, the recess portion 512 includes the recess portion 512a opening to the lower surface of the second base substrate 51 and the recess portion 512b which opens to the bottom surface of the recess portion 512a and has an opening smaller than the recess portion 512a. The first circuit element 7 is fixed to the bottom surface of the recess portion 512b. The plurality of internal terminals 542 are provided on the bottom surface of the recess portion 512a. The internal terminals 542 and the first circuit element 7 are electrically coupled to each other through the bonding wire BW3. An internal space S6 formed by the recess portion 512 and the recess portion 211 may be airtight or communicate with the internal space S2.

The recess portion 511 includes the recess portion 511a opening to the upper surface of the second base substrate 51, and the recess portion 511b which opens to the bottom surface of the recess portion 511a and has an opening smaller than the recess portion 511a. The resonator element 6 is fixed to the bottom surface of the recess portion 511b. The plurality of internal terminals 541 are disposed on the bottom surface of the recess portion 511b. The resonator element 6 and the plurality of internal terminals 541 are electrically coupled to each other through the bonding wire BW2.

As described above, the resonator element 6 and the first circuit element 7 are disposed with a portion 513 interposed between the recess portion 511 and the recess portion 512 of the second base substrate 51. Thus, the resonator element 6 and the first circuit element 7 are thermally combined through the portion 513, and the temperature difference between the resonator element 6 and the temperature sensor 71 in the first circuit element 7 becomes smaller. Therefore, the oscillator 1 capable of outputting a frequency signal having high accuracy is obtained.

Even in the third embodiment, similar to the above-described first embodiment, the second circuit element 4, the temperature compensated crystal oscillator 3, and each of the discrete components 81 and 82 are disposed to overlap each other in plan view. Therefore, it is possible to suppress expansion of the outer package 2 in the X-axis direction and the Y-axis direction and to reduce the size of the oscillator 1.

As described above, the oscillator 1 in the fourth embodiment includes the outer package 2 as the first container, the inner package 5 as the second container, which is accommodated in the outer package 2, includes the second base substrate 51 as the base substrate and the second lid 52 as the lid, which is bonded to the upper surface (one main surface) of the second base substrate 51, and has the internal space S5, the resonator element 6 which is disposed in the internal space S5 and is disposed on the second base substrate 51, the temperature sensor 71 which is disposed on the lower surface (the other main surface) of the second base substrate

51, the first circuit element 7 which is disposed on the lower surface side of the second base substrate 51, causes the resonator element 6 to oscillate, and includes the oscillation circuit 72 that generates an oscillation signal subjected to temperature compensation based on the detected temperature of the temperature sensor 71, and the second circuit element 4 which is accommodated in the outer package 2 and includes the PLL circuit 40 as the frequency control circuit, that controls the frequency of the oscillation signal. The inner package 5 and the second circuit element 4 are spaced from each other and are disposed to overlap each other in plan view.

According to such a configuration, the temperature sensor 71 and the resonator element 6 are thermally combined through the second base substrate 51. Since the inner package 5 and the second circuit element 4 are disposed to be spaced from each other, heat exchange between the inner package 5 and the second circuit element 4 is suppressed, and thus it is possible to suppress an occurrence of a situation in which the temperature sensor 71 and the resonator element 6 are unevenly heated. Therefore, it is possible to effectively suppress the occurrence of a temperature difference between the resonator element 6 and the temperature sensor 71 by heat of the second circuit element 4. Therefore, it is possible to detect the temperature of the resonator element 6 by the temperature sensor 71 with higher accuracy, and thus temperature compensation by the oscillation circuit 72 becomes more accurate. Accordingly, the oscillator 1 capable of outputting a frequency signal having high accuracy is obtained.

Since the inner package 5 and the second circuit element 4 are disposed to overlap each other in the Z-axis direction, expansion of the outer package 2 in the X-axis direction and the Y-axis direction is suppressed, and it is possible to reduce the size of the oscillator 1.

Fifth Embodiment

Figure 8:
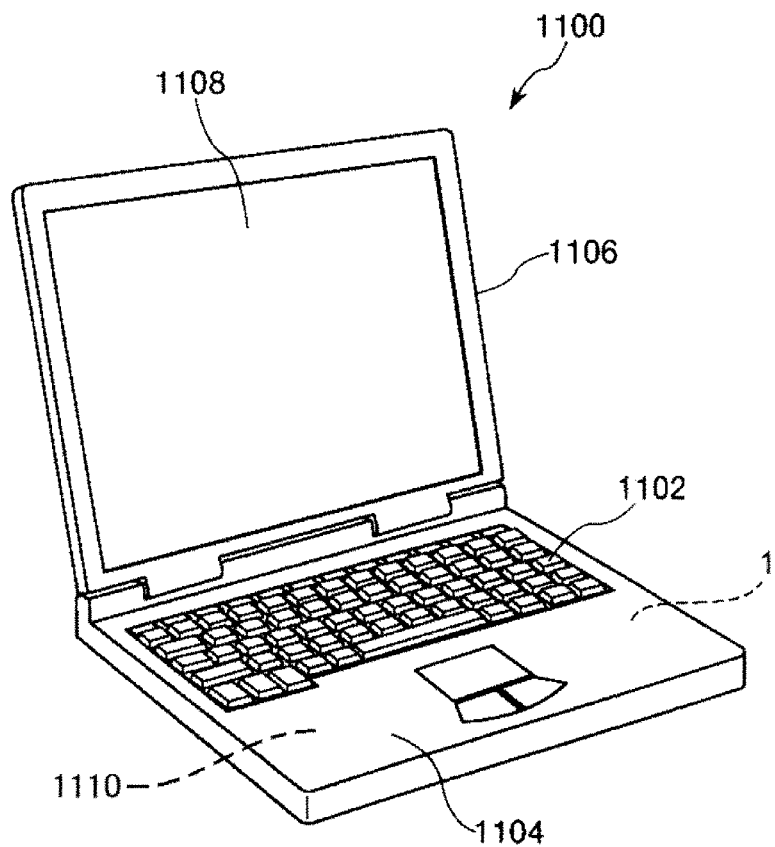
FIG. 8 is a perspective view illustrating a personal computer according to a fifth embodiment.

FIG. 8 is a perspective view illustrating a personal computer according to a fifth embodiment.

A personal computer 1100 as an electronic device illustrated in FIG. 8 includes a main body 1104 including a keyboard 1102 and a display unit 1106 including a display portion 1108. The display unit 1106 is supported to be rotatable around the main body 1104 with a hinge structure portion. The oscillator 1 is mounted in such a personal computer 1100. The personal computer 1100 includes a signal processing circuit 1110 that performs arithmetic processing relating to control of the keyboard 1102, the display portion 1108, and the like. The signal processing circuit 1110 operates based on the oscillation signal output from the oscillator 1.

As described above, the personal computer 1100 as the electronic device includes the oscillator 1 and the signal processing circuit 1110 that performs signal processing based on the output signal (oscillation signal) of the oscillator 1. Therefore, it is possible to provide the effect of the oscillator 1 described above and to exhibit high reliability.

In addition to the above-described personal computer 1100, the electronic device including the oscillator 1 includes, for example, a digital still camera, a smartphone, a tablet terminal, a watch including a smart watch, an ink jet discharge device such as an ink jet printer, a wearable terminal such as an HMD (head mounted display), a TV, a video camera, a video tape recorder, a car navigation device, a pager, an electronic notebook, an electronic dictionary, a calculator, an electronic game machine, a word processor, a workstation, a video phone, a security monitor, electronic binoculars, a POS terminal, medical equipment such as an electronic thermometer, a blood pressure monitor, a blood glucose meter, an electrocardiogram measuring device, an ultrasound diagnostic device, and an electronic endoscope, a fish detector, various measuring devices, instruments of automobiles, aircrafts, ships, a base station for a portable terminal, and a flight simulator.

Sixth Embodiment

Figure 9:
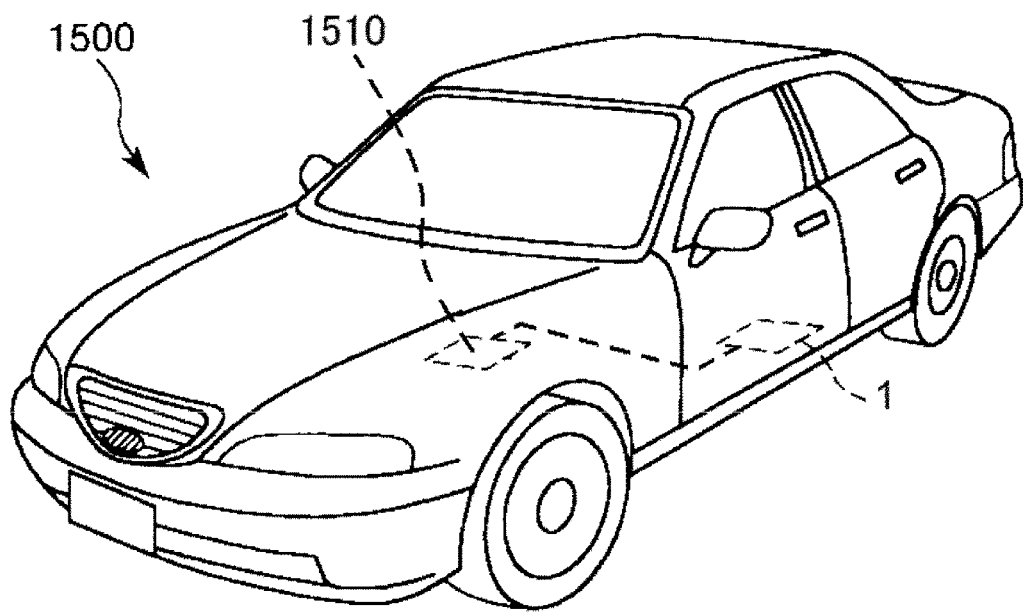
FIG. 9 is a perspective view illustrating an automobile according to a sixth embodiment.

FIG. 9 is a perspective view showing an automobile according to a sixth embodiment.

As illustrated in FIG. 9, the oscillator 1 and a signal processing circuit 1510 that operates based on the oscillation signal output from the oscillator 1 are mounted in an automobile 1500 as a vehicle. For example, the oscillator 1 and the signal processing circuit 1510 may be widely applied to electronic control units (ECUs) of a keyless entry, an immobilizer, a car navigation system, a car air conditioner, an anti-lock brake system (ABS), an airbag, a tire pressure monitoring system (TPMS), an engine controller, a battery monitor for a hybrid automobile or an electric automobile, and an automobile attitude control system.

As described above, the automobile 1500 as a vehicle includes the oscillator 1 and the signal processing circuit 1510 that performs signal processing based on the output signal (oscillation signal) of the oscillator 1. Therefore, it is possible to provide the effect of the oscillator 1 described above and to exhibit high reliability.

The vehicle including the oscillator 1 may be, for example, a robot, a drone, a two-wheeled automobile, an aircraft, a ship, a train, a rocket, or a spacecraft in addition to the automobile 1500.

Hitherto, the oscillator, the electronic device, and the vehicle according to the embodiments of the disclosure are described. However, the disclosure is not limited to the above descriptions, and the configuration of each component may be replaced with any configuration having the similar function. Any other component may be added to the disclosure. The above-described embodiments may be appropriately combined.

What is claimed is:
1. An oscillator comprising:
a first container;
a second container accommodated in the first container;
a resonator element accommodated in the second container;
a temperature sensor accommodated in the second container;
a first circuit element that is accommodated in the second container and includes an oscillation circuit that causes the resonator element to oscillate so as to generate an oscillation signal on which temperature compensation is performed based on a detected temperature of the temperature sensor; and
a second circuit element that is accommodated in the first container and includes a frequency control circuit that controls a frequency of the oscillation signal,
wherein the second container and the second circuit element are spaced from each other and are disposed to overlap each other in plan view,
wherein the first container includes a first base substrate having a recess portion, and a first lid bonded to the first base substrate so as to close an opening of the recess portion, wherein the second container is disposed in the recess portion, and wherein the second circuit element is disposed between the second container and the first lid.

2. The oscillator according to claim 1, wherein the recess portion includes
   a first recess portion opening to a surface of the first base substrate on the lid side, and
   a second recess portion opening to a bottom surface of the first recess portion, the second container is bonded to a bottom surface of the second recess portion, the second circuit element is bonded to the bottom surface of the first recess portion, and the second circuit element overlaps the second recess portion in plan view.

3. The oscillator according to claim 2, wherein the recess portion includes a third recess portion opening to the bottom surface of the second recess portion, and the oscillator further comprises a bypass capacitor disposed in the third recess portion.

4. The oscillator according to claim 3, wherein the second container includes a power supply terminal to which a power supply voltage for the oscillation circuit is applied, and the bypass capacitor is coupled to the power supply terminal.

5. The oscillator according to claim 1, wherein the second container includes a temperature output terminal to which an output signal of the temperature sensor is output, and the temperature output terminal is electrically coupled to the frequency control circuit.

6. The oscillator according to claim 1, wherein the first container is decompressed with respect to atmospheric pressure.

7. The oscillator according to claim 1, wherein the second container includes
   a second base substrate to which the resonator element is fixed, and
   a second lid bonded to the second base substrate so as to accommodate the resonator element in a space between the second lid and the second base substrate, and the second lid is bonded to the second base substrate through a bonding member.

8. An oscillator comprising:
   a first container that includes a base substrate and a lid bonded to one main surface of the base substrate and has an internal space;
   a second container disposed in the internal space;
   a resonator element accommodated in the second container;
   a temperature sensor accommodated in the second container;
   a first circuit element that is accommodated in the second container and includes an oscillation circuit that causes the resonator element to oscillate so as to generate an oscillation signal on which temperature compensation is performed based on a detected temperature of the temperature sensor; and
   a second circuit element that is disposed on the other main surface of the base substrate and includes a frequency control circuit that controls a frequency of the oscillation signal, wherein the second container and the second circuit element are spaced from each other and are disposed to overlap each other in plan view.

9. An oscillator comprising:
   a first container;
   a second container that is accommodated in the first container, includes a first base substrate and a first lid bonded to one main surface of the first base substrate, and has an internal space;
   a resonator element that is disposed in the internal space and is disposed on the first base substrate;
   a temperature sensor disposed on the other main surface of the first base substrate;
   a first circuit element that is disposed on the other main surface of the first base substrate and includes an oscillation circuit that causes the resonator element to oscillate so as to generate an oscillation signal on which temperature compensation is performed based on a detected temperature of the temperature sensor; and
   a second circuit element that is accommodated in the first container and includes a frequency control circuit that controls a frequency of the oscillation signal, wherein the second container and the second circuit element are spaced from each other and are disposed to overlap each other in plan view, wherein the first container includes a second base substrate having a recess portion, and a second lid bonded to the second base substrate so as to close an opening of the recess portion, wherein the second container is disposed in the recess portion, and wherein the second circuit element is disposed between the second container and the second lid.

10. An electronic device comprising:
    the oscillator according to claim 1; and
    a signal processing circuit that performs signal processing based on an output signal of the oscillator.

11. A vehicle comprising:
    the oscillator according to claim 1; and
    a signal processing circuit that performs signal processing based on an output signal of the oscillator.

* * * * *